US009070963B2

(12) United States Patent
Ono

(10) Patent No.: US 9,070,963 B2
(45) Date of Patent: Jun. 30, 2015

(54) DUPLEXER

(75) Inventor: Satoru Ono, Tokyo (JP)

(73) Assignee: TAIYO YUDEN CO., LTD., Tokyo (JP)

(*) Notice: Subject to any disclaimer, the term of this patent is extended or adjusted under 35 U.S.C. 154(b) by 0 days.

(21) Appl. No.: 13/610,399

(22) Filed: Sep. 11, 2012

(65) Prior Publication Data

US 2013/0002371 A1    Jan. 3, 2013

Related U.S. Application Data

(63) Continuation of application No. PCT/JP2011/059745, filed on Apr. 20, 2011.

(51) Int. Cl.
*H01P 1/213* (2006.01)
*H03H 9/72* (2006.01)
*H04B 1/52* (2006.01)
*H04B 1/525* (2015.01)

(52) U.S. Cl.
CPC .............. *H01P 1/2135* (2013.01); *H03H 9/725* (2013.01); *H04B 1/525* (2013.01)

(58) Field of Classification Search
CPC ....... H03H 9/725; H01P 1/2135; H04B 1/525
USPC .......... 333/100, 124, 126, 129, 132, 133, 134
See application file for complete search history.

(56) References Cited

U.S. PATENT DOCUMENTS 4,499,440 A * 2/1985 Grudkowski ................. 333/151
2003/0132817 A1   7/2003 Nagai
2005/0116789 A1   6/2005 Hongo et al.

(Continued)

FOREIGN PATENT DOCUMENTS

CN    1622455 A    6/2005
CN    101689846 A  3/2010

(Continued)

OTHER PUBLICATIONS

Koga et al, English language translation of WO 2009/028683, Mar. 2009.*
International Search Report (ISR) issued in PCT/JP2011/059745 mailed in Aug. 2011.
Written Opinion (PCT/ISA/237) issued in PCT/JP2011/059745 mailed in Aug. 2011.

(Continued)

*Primary Examiner* — Robert Pascal
*Assistant Examiner* — Gerald Stevens
(74) *Attorney, Agent, or Firm* — Chen Yoshimura LLP

(57) ABSTRACT

A duplexer includes: a reception filter connected between a reception terminal and an antenna terminal; a transmission filter connected between a transmission terminal and the antenna terminal; and a wiring substrate including the reception filter and the transmission filter on an upper surface, the reception terminal, the transmission terminal and the antenna terminal being formed on a lower surface, and a reception electrode electrically connected to the reception terminal, a transmission electrode electrically connected to the transmission terminal, an antenna electrode electrically connected to the antenna terminal, and a circular metal layer surrounding the reception, transmission and antenna electrodes, and electrically connected to a ground being formed on an upper surface, wherein a shortest distance between a side of the circular metal layer closest to the reception and transmission terminals and the reception electrode is larger than a width of the side of the circular metal layer.

9 Claims, 8 Drawing Sheets

(56) References Cited

U.S. PATENT DOCUMENTS

| | | | |
|---|---|---|---|
| 2005/0264375 A1 | 12/2005 | Ikuta et al. | |
| 2006/0138672 A1* | 6/2006 | Sakinada et al. | 257/778 |
| 2007/0013458 A1* | 1/2007 | Itou et al. | 333/133 |
| 2010/0066209 A1* | 3/2010 | Saitou et al. | 310/340 |
| 2011/0109400 A1 | 5/2011 | Koga et al. | |

FOREIGN PATENT DOCUMENTS

| | | | | |
|---|---|---|---|---|
| JP | 2003-204245 A | 7/2003 | | |
| JP | 2005-159896 A | 6/2005 | | |
| JP | 2006-014296 A | 1/2006 | | |
| JP | 2006-203149 A | 8/2006 | | |
| JP | 2007-258832 A | 10/2007 | | |
| JP | 2010-74418 A | 4/2010 | | |
| WO | WO 2009/028683 | * | 3/2009 | H03H 9/25 |

OTHER PUBLICATIONS

English translation of International Search Report (ISR) issued in PCT/JP2011/059745 mailed in Aug. 2011.

Chinese Office Action dated Jan. 30, 2014, in a counterpart Chinese patent application No. 201180030472.6.

Chinese Office Action dated Apr. 10, 2015, in a counterpart Chinese patent application No. 201180030472.6.

* cited by examiner

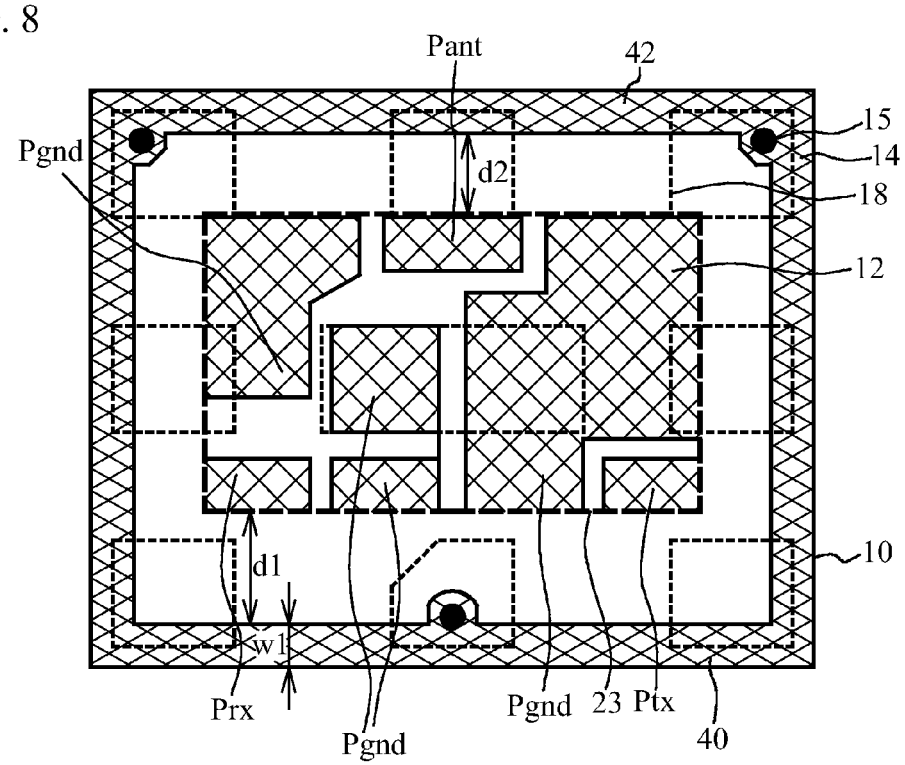

DUPLEXER

CROSS-REFERENCE TO RELATED APPLICATION

This application is a continuation application of PCT/JP2011/059745 filed Apr. 20, 2011, the contents of which are herein wholly incorporated by reference.

FIELD

The present invention relates to a duplexer, and to a duplexer in which a reception filter and a transmission filter are mounted on a single substrate.

BACKGROUND

Duplexers (also referred to as a duplexer, an antenna duplexer, or a branching filter) are mainly used for wireless communication of mobile phones and the like. In recent years, as mobile phones and the like become to have high functionality, small and highly reliable components are demanded. To meet such a demand, there has been known a technique in which a chip component such as an acoustic wave filter is mounted on an upper surface of a wiring substrate by the flip chip method and is sealed by solder material as disclosed in Japanese Patent Application Publication No. 2006-203149 (Patent Document 1). In Patent Document 1, a metal layer is arranged in a circular pattern on an upper surface of a wiring substrate so as to fix a sealing solder on the wiring substrate. In a structure disclosed in Patent Document 1, a leakage electric field is generated from an acoustic wave filter due to the contact of a solder sealing portion with the acoustic wave filter. In order to suppress this leakage electric field, it has been known sandwiching an insulating layer having a permittivity lower than that of the acoustic wave filter between a chip component and a solder sealing portion as disclosed in Japanese Patent Application Publication No. 2010-74418 (Patent Document 2). It has been known to suppress the degradation of transmission-reception isolation characteristics by forming a duplexer including an acoustic wave filter by using a technique disclosed in Patent Document 2.

However, when further downsizing is performed in the duplexer in which the technique disclosed in Patent Document 1 and Patent Document 2 is used, an unnecessary signal leaks from a transmission side to a reception side through a circular metal layer formed on the upper surface of the wiring substrate, and transmission-reception isolation characteristics are degraded.

SUMMARY OF THE INVENTION

According to an aspect of the present invention, there is provided a duplexer including: a reception filter that is connected between a reception terminal and an antenna terminal; a transmission filter that is connected between a transmission terminal and the antenna terminal; and a wiring substrate that includes the reception filter and the transmission filter on an upper surface, the reception terminal, the transmission terminal and the antenna terminal being formed on a lower surface, and a reception electrode electrically connected to the reception terminal, a transmission electrode electrically connected to the transmission terminal, an antenna electrode electrically connected to the antenna terminal, and a circular metal layer surrounding the reception electrode, the transmission electrode and the antenna electrode, and electrically connected to a ground being formed on an upper surface, wherein a shortest distance between a side of the circular metal layer that is closest to the reception terminal and the transmission terminal and the reception electrode is larger than a width of the side of the circular metal layer.

BRIEF DESCRIPTION OF THE DRAWINGS

FIG. 8 is a top view illustrating a structure of a wiring substrate in a fourth embodiment of the present invention.

DETAILED DESCRIPTION

Figure 1:
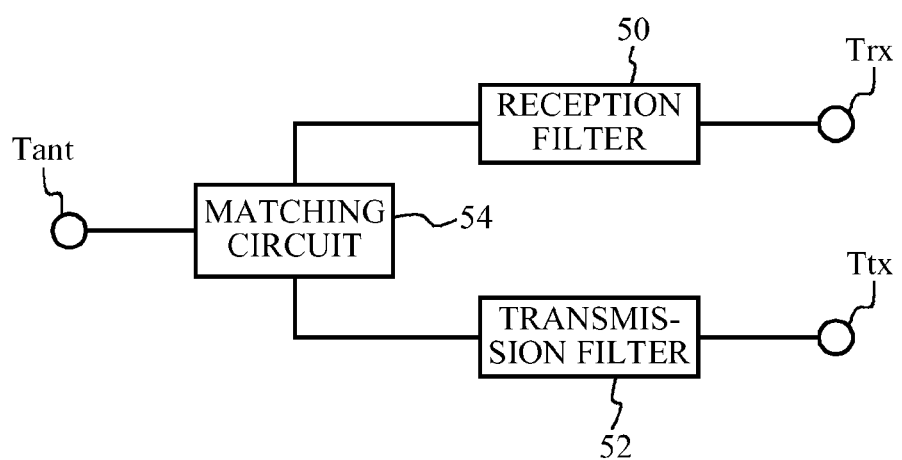
FIG. 1 is a functional block diagram illustrating a configuration of a duplexer.

A description will now be given of embodiments of the present invention with reference to drawings.
First Embodiment A description will be given of a duplexer first. FIG. 1 is a functional block diagram illustrating a configuration of the duplexer.

In the duplexer, a reception filter 50 is connected between a reception terminal Trx and an antenna terminal Tant. A transmission filter 52 is connected between a transmission terminal Ttx and the antenna terminal Tant. A matching circuit 54 is located between the antenna terminal Tant and at least one of the reception filter 50 and the transmission filter 52.

In the above described configuration, the reception filter 50 filters reception signals input to the antenna terminal Tant and outputs them to the reception terminal Trx. The reception filter 50 suppresses the output of transmission signals to the reception terminal Trx by suppressing transmission signals. On the other hand, the transmission filter 52 filters transmission signals input to the transmission terminal Ttx, and outputs them to the antenna terminal Tant. The transmission filter 52 suppresses the output of reception signals to the transmission terminal Ttx by suppressing reception signals.

The reception signal and the transmission signal have different frequency bands, and the reception filter 50 and the transmission filter 52 have different passbands.

The matching circuit 54 matches the impedance between the antenna terminal Tant and the reception filter 50 and the transmission filter 52. Transmission-reception isolation characteristics represent the degree of leakage of the signal from the transmission terminal Ttx to the reception terminal Trx. When transmission-reception isolation characteristics are degraded, the transmission signal easily leaks from the transmission terminal Ttx to the reception terminal Trx.

Figure 2:
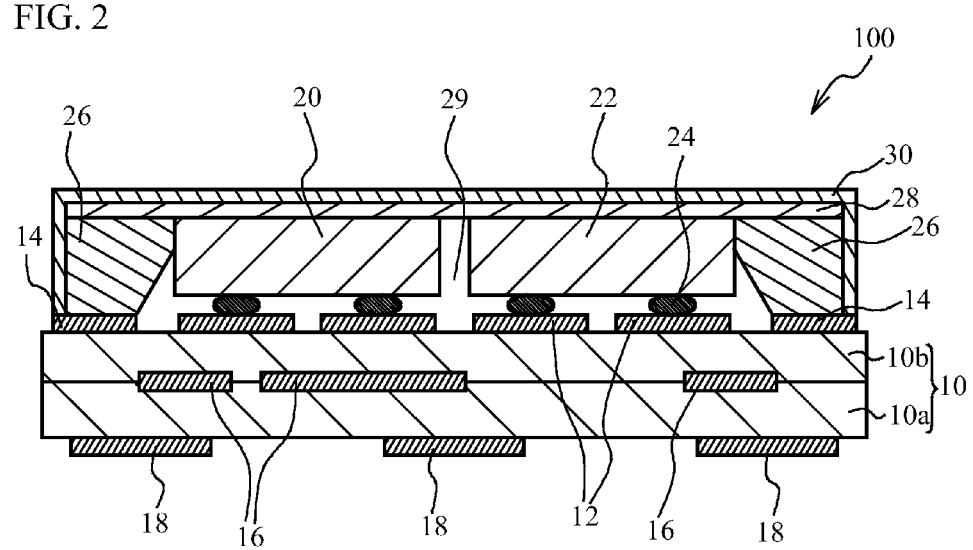
FIG. 2 is a cross-sectional view illustrating a structure of a duplexer in accordance with a first embodiment of the present invention.

A cross-sectional structure of the duplexer in accordance with the first embodiment of the present invention is illustrated in FIG. 2. This cross-section corresponds to a cross-section taken along line X-X in FIG. 3A.

As illustrated in FIG. 2, a duplexer 100 in accordance with the first embodiment includes a wiring substrate 10, a reception filter chip 20, a transmission filter chip 22 and a metal sealing portion 26.

The wiring substrate 10 is made of a ceramic material mainly based on two-layer aluminum oxide or a resin material, and metal layers are selectively located on the upper surface, between layers, and on the lower surface.

That is to say, electrode terminals 12 to which an electrode of a filter chip is connected and a circular metal layer 14 that is located away from the electrode terminals 12 and located near an outer edge portion of the upper surface of an insulating layer 10b so as to surround the electrode terminals 12 are located on the upper surface of the insulating layer 10b that is an upper layer.

In addition, wiring metal layers 16 are selectively located between the insulating layer 10b and an insulating layer 10a that is a lower layer, that is to say, between layers, and moreover, external connection electrode terminals (foot pads) 18 are selectively located on a surface (lower surface) of the insulating layer 10a that is a lower layer.

The electrode terminals 12, the circular metal layer 14, the wiring metal layers 16 and the external connection electrode terminals 18 are connected each other by layer-to-layer connecting conductors (not illustrated) selectively located in the insulating layers 10a and 10b. The circular metal layer 14 is connected to the external connection electrode terminals 18 made to have a ground potential.

The electrode terminals 12, the circular metal layer 14 and the wiring metal layers 16 are formed of copper (Cu), silver (Ag), gold (Au) or the like.

The reception filter chip 20 and the transmission filter chip 22 are flip-chip mounted to the upper surface of the wiring substrate 10 via bumps 24 made of copper. That is to say, the active region (filter formation surface) of the filter chip is located so as to face the upper surface of the wiring substrate 10.

The reception filter chip 20 and the transmission filter chip 22 are surrounded by the metal sealing portion 26. The metal sealing portion 26 is made of tin (Sn)-silver (Ag)-copper (Cu) solder, its internal surface contacts side surfaces of filter chips, and its lower surface contacts the circular metal layer 14.

A cap plate 28 made of kovar is located on the reception filter chip 20, the transmission filter chip 22 and the metal sealing portion 26.

That is to say, the reception filter chip 20 and the transmission filter chip 22 are accommodated in a cavity 29 formed by the cap plate 28 and the metal sealing portion 26, and sealed by the wiring substrate 10.

In addition, the metal sealing portion 26 and the cap plate 28 are coated with a protective film 30 made of nickel (Ni), and the protective film 30 is also in contact with the circular metal layer 14.

According to the above described structure, it is possible to perform the seal having a high airtightness compared to a resin seal and provide a high shielding effectiveness by sealing the reception filter chip 20 and the transmission filter chip 22 with the metal sealing portion 26, the cap plate 28, and the protective film 30.

In addition, it is possible to prevent or suppress the deformation of the metal sealing portion 26 due to the heat applied when the duplexer 100 is mounted to a substrate for being mounted in an electronic device by using the cap plate 28 and the protective film 30.

In addition to copper, gold or solder may be used as a material forming the bumps 24. In addition, as the metal sealing portion 26, solder or metal other than tin-silver-copper described previously may be used.

Furthermore, as the cap plate 28 and the protective film 30, in addition to the previously described metal, an insulating material may be used. However, it is preferable that melting points of the cap plate 28 and the protective film 30 are higher than the melting point of the metal sealing portion 26. In addition, a single layer or more than three-layer structure is selected for the wiring substrate 10 as necessary.

Figure 3A:
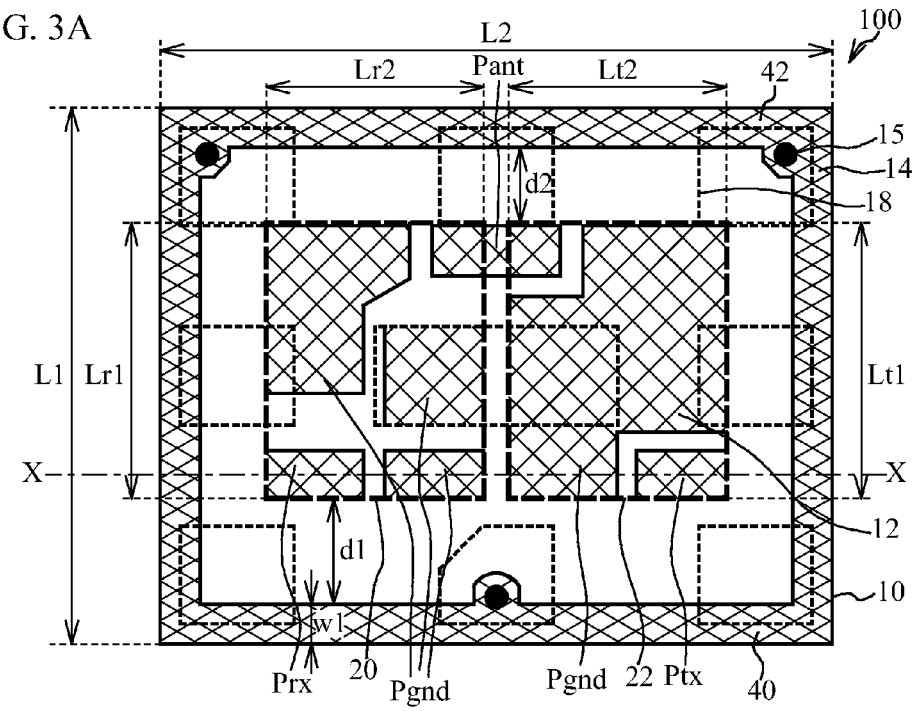
FIG. 3A is a top view illustrating a structure of a wiring substrate in the first embodiment.
Figure 3B:
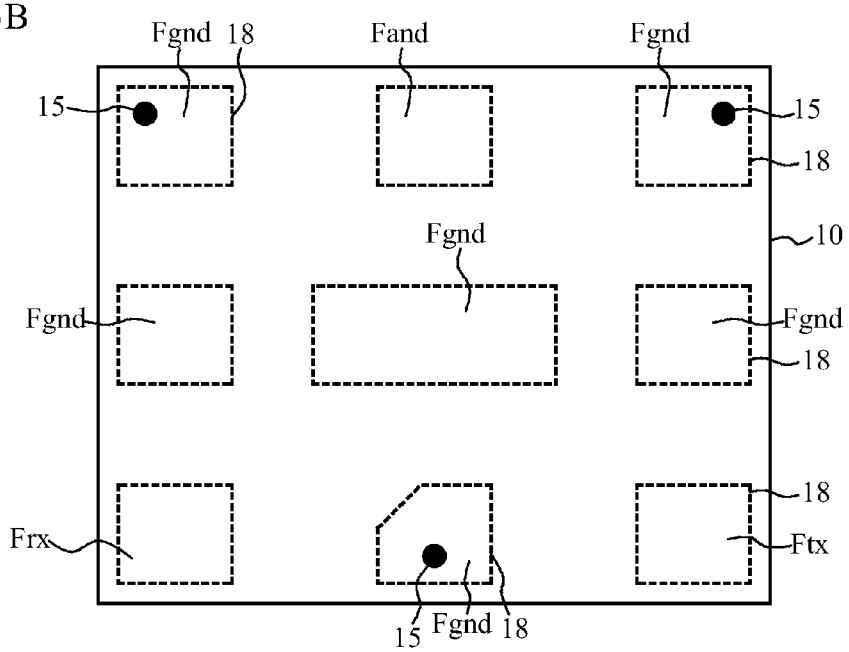
FIG. 3B is a transparent view of a lower surface of the wiring substrate viewed from an upper position.

The upper surface of the wiring substrate 10 in the duplexer 100 in accordance with the first embodiment is illustrated in FIG. 3A, and a state in which the lower surface of the wiring substrate 10 is viewed from the upper position transparently is illustrated in FIG. 3B.

In FIG. 3A, outer shapes of the reception filter chip 20 and the transmission filter chip 22 to be mounted are illustrated with rectangles drawn with bold dashed lines.

An antenna electrode Pant, a reception electrode Prx, a transmission electrode Ptx and a ground electrode Pgnd are formed on the upper surface of the wiring substrate 10 located directly below the reception filter chip 20 and the transmission filter chip 22 with the electrode terminals 12.

An antenna electrode, a reception electrode and a ground electrode in the reception filter chip 20 are connected to the antenna electrode Pant, the reception electrode Prx, and the ground electrode Pgnd via the bumps 24 (see FIG. 2). On the other hand, an antenna electrode, a transmission electrode and a ground electrode in the transmission filter chip 22 are connected to the antenna electrode Pant, the transmission electrode Ptx, and the ground electrode Pgnd via the bumps 24.

That is to say, the antenna electrode Pant, the reception electrode Prx, the transmission electrode Ptx and the ground electrode Pgnd function as a signal line transmitting signals and the like, and function as a mounting/fixing pad in flip-chip mounting the reception filter chip 20 and the transmission filter chip 22.

On the upper surface of the wiring substrate 10, the circular metal layer 14 having a given width is located along the outer edge portion, and surrounds the electrode terminals 12 such as the antenna electrode Pant, the reception electrode Prx, the transmission electrode Ptx, and the ground electrode Pgnd. In FIG. 3A, the electrode terminals 18 located on the lower surface of the wiring substrate 10 are illustrated by a thin dashed line.

On the other hand, as illustrated in FIG. 3B, on the lower surface of the wiring substrate 10, a transmission foot pad Ftx functioning as the transmission terminal Ttx, a reception foot pad Frx functioning as the reception terminal Trx, an antenna foot pad Fant functioning as the antenna terminal Tant, and a ground foot pad Fgnd functioning as a ground terminal are formed with the electrode terminals 18.

The transmission foot pad Ftx, the reception foot pad Frx, the antenna foot pad Fant and the ground foot pad Fgnd are electrically connected to the transmission electrode Ptx, the reception electrode Prx, the antenna electrode Pant and the ground electrode Pgnd respectively via the wiring metal layers 16 of the wiring substrate 10 and layer-to-layer connecting conductors (via) 15. In the first embodiment, the reception electrode Prx is a single reception electrode, and the reception signal is an unbalanced signal.

In addition, the circular metal layer 14 is electrically connected to the ground foot pad Fgnd via the layer-to-layer connecting conductors 15.

Here, the side of the circular metal layer 14 closest to the reception foot pad Frx and the transmission foot pad Ftx is referred to as a first side 40, and a side facing the first side 40 is referred to as a second side 42.

A width of the first side 40 is expressed as a width W1, a shortest distance between the first side 40 and the reception electrode Prx is expressed as a distance d1, and a shortest distance between the second side 42 and the antenna electrode Pant is expressed as a distance d2.

In the duplexer of the first embodiment, the reception filter 50 is a ladder-type filter using a piezoelectric film resonator, and the transmission filter 52 is a ladder-type filter using a surface acoustic wave resonator.

The chip size of the reception filter chip 20 Lr1*Lr2 is made to be 1.0 mm*0.79 mm, the chip size of the transmission filter chip 22 Lt1*Lt2 is made to be 1.0 mm*0.79 mm.

In addition, the outside dimension of the wiring substrate 10 L1*L2 is made to be 2.0 mm*2.5 mm. Furthermore, each of film thicknesses of the first insulating layer 10a and the second insulating layer 10b is made to be 0.089 mm.

The width W1 of the circular metal layer 14 is made to be 0.15 mm, and the distance d1 and the distance d2 are made to be 0.40 mm and 0.30 mm respectively.

Figure 4:
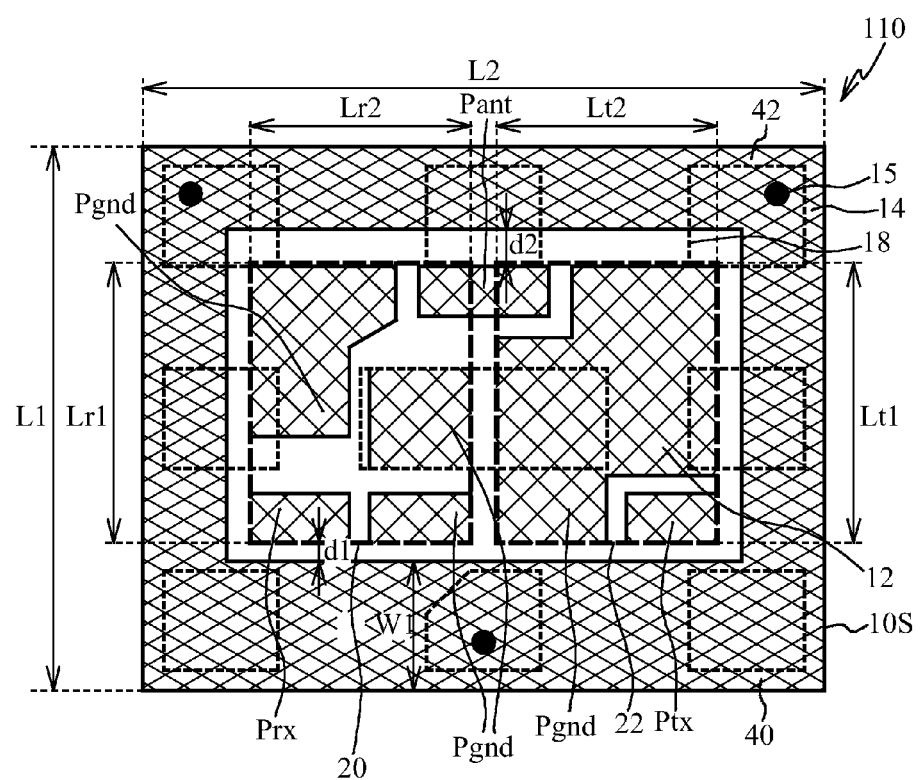
FIG. 4 is a top view illustrating a structure of a wiring substrate in a comparative example.

An upper surface of a wiring substrate 10S in a duplexer 110 in accordance with a comparative example is illustrated in FIG. 4.

As illustrated in FIG. 4, in the duplexer 110 in accordance with the comparative example, the width W1 of the circular metal layer 14 is made to be 0.47 mm, the distance d1 and the distance d2 are made to be 0.08 mm and 0.15 mm respectively.

The chip size of the reception filter chip 20 Lr1*Lr2, the chip size of the transmission filter chip 22 Lt1*Lt2, the size of the wiring substrate 10 L1*L2, and the film thicknesses of the insulating layers 10a and 10b are made to be the same as those of the first embodiment. Other structures are the same as those of the first embodiment, and a description is omitted.

With respect to duplexers in accordance with the first embodiment and the comparative example, transmission-reception isolation characteristics are measured. A transmission band is selected to be 1850 MHz to 1910 MHz and a reception band is selected to be 1930 MHz to 1990 MH.

Figure 5:
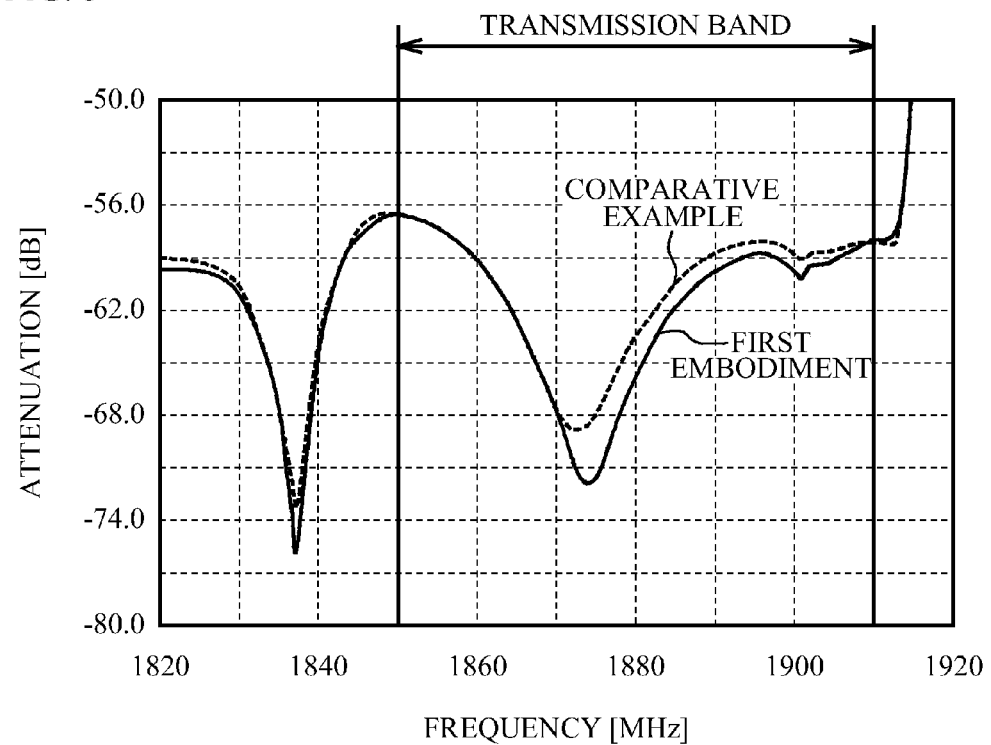
FIG. 5 is a diagram illustrating isolation characteristics of duplexers in accordance with the first embodiment and the comparative example.

Isolation characteristics of duplexers in the first embodiment and the comparative example are illustrated in FIG. 5. As illustrated, in the duplexer in the first embodiment of the present invention, compared to the comparative example, the attenuation in the transmission band increases, and transmission-reception isolation characteristics are obviously improved.

From such transmission-reception isolation characteristics, the leakage of the signal from the transmission foot pad Ftx to the reception electrode Prx caused by the electromagnetic coupling between the transmission foot pad Ftx and the circular metal layer 14 or the electromagnetic coupling between the circular metal layer 14 and the reception electrode Prx is considered as a reason of the degradation of transmission-reception isolation characteristics.

When the width W1 of the circular metal layer 14 is wide, the electromagnetic coupling between the transmission foot pad Ftx and the circular metal layer 14 easily occurs, and the electromagnetic coupling between the circular metal layer 14 and the reception electrode Prx easily occurs.

On the other hand, when the distance between the circular metal layer 14 and the reception electrode Prx is short, the electromagnetic coupling between the circular metal layer 14 and the reception electrode Prx easily occurs.

Therefore, it is preferable that the shortest distance d1 between the first side 40 of the circular metal layer 14 and the reception electrode Prx is larger than the width W1. In addition, it is more preferable that the distance d1 is more than 1.5 times larger than the width W1, and it is further preferable that the distance d1 is more than two times larger than the width W1.

In the reception filter chip 20, the reception pad and the antenna pad are located away from each other to suppress the interference between both pads. Thus, the reception pad and the antenna pad are located on a diagonal line of the reception filter chip 20.

Therefore, in a case where the reception filter chip 20 is located in the circular metal layer 14, when the reception electrode Prx is made to be located away from the circular metal layer 14, the antenna electrode Pant comes close to the circular metal layer 14.

In such a case, it is preferable that the shortest distance d1 between the first side 40 of the circular metal layer 14 and the reception electrode Prx is larger than the shortest distance d2 between the second side 42 of the circular metal layer 14 and the antenna electrode Pant. Furthermore, it is more preferable that the distance d1 is more than 1.5 times larger than the distance d2, and it is further preferable that the distance d1 is more than two times larger than the distance d2.

As described in the first embodiment, in a case where the metal sealing portion 26 contacts the circular metal layer 14 and seals the reception filter and the transmission filter, as the volume of the circular-shaped metal becomes large, the leakage of the transmission signal through the circular metal layer 14 and the metal sealing portion 26 increases.

Therefore, it is preferable to perform the arrangement described in the first embodiment when the metal sealing portion 26 is provided.

In the first embodiment, the planar shape of the wiring substrate 10 is a quadrangle (rectangle). In such a case, in order to make respective intervals among the reception foot pad Frx, the transmission foot pad Ftx, and the antenna foot pad Fant large, it is preferable to dispose the reception foot pad Frx and the transmission foot pad Ftx near both ends of the first side 40 of the circular metal layer 14, and to dispose the antenna foot pad Fant in a center part of the second side 42 facing the first side 40.

When the wiring substrate 10 is in a plate shape, the connection between the circular metal layer 14 and the reception electrode Prx becomes large. Therefore, it is preferable to perform the arrangement of the first embodiment.

The reception filter chip 20 and the transmission filter chip 22 may be face-up mounted to the wiring substrate 10. However, to reduce the size of the duplexer, it is preferable that the reception filter chip 20 and the transmission filter chip 22 are flip-chip mounted to the wiring substrate 10.

As the transmission filter 52 and the reception filter 50, a filter using a surface acoustic wave resonator or a piezoelectric film resonator may be used. In addition, as the reception filter 50 and the transmission filter 52, a ladder-type filter or a multimode filter may be used.

In addition, it is sufficient if the circular metal layer 14 surrounds at least a part of the antenna electrode Pant, the reception electrode Prx, the transmission electrode Ptx and the ground electrode Pgnd. However, to seal the reception filter chip 20 and the transmission filter chip 22 air-tightly with the metal sealing portion 26, it is preferable that the circular metal layer 14 completely surrounds the antenna electrode Pant, the reception electrode Prx, the transmission electrode Ptx and the ground electrode Pgnd. The circular metal layer 14 is electrically connected to the ground foot pad Fgnd via at least one of the layer-to-layer connecting conductors 15.

Second Embodiment

Figure 6:
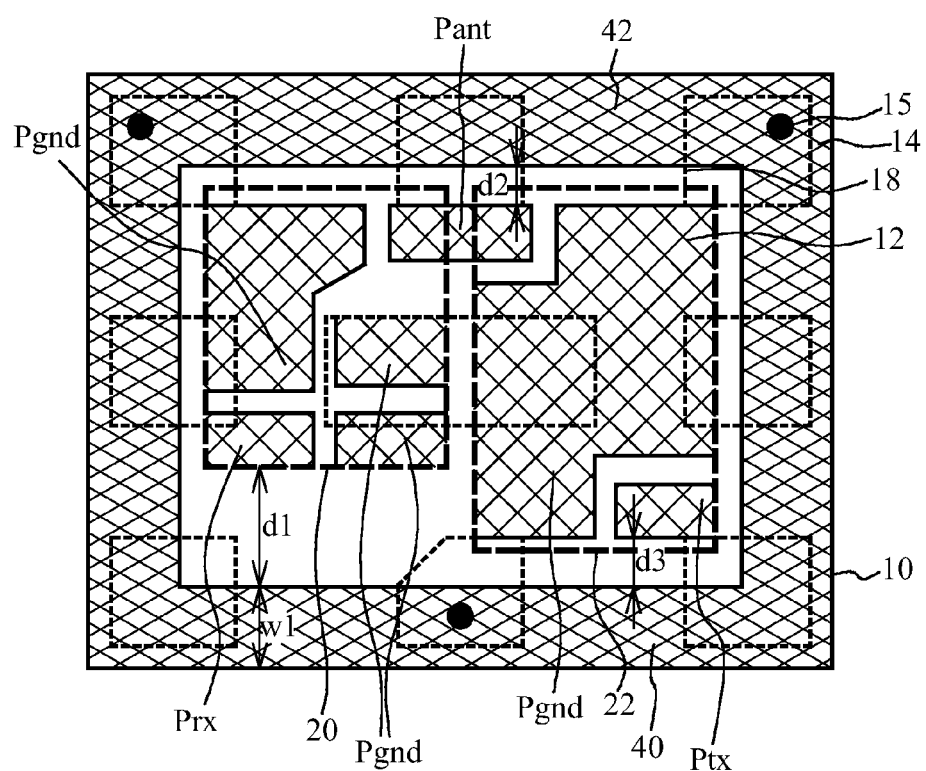
FIG. 6 is a top view illustrating a structure of a wiring substrate in a second embodiment of the present invention.

A top view of the wiring substrate 10 in a second embodiment of the present invention is illustrated in FIG. 6. In the second embodiment, compared to the first embodiment illustrated in FIG. 3A, the chip size of the transmission filter chip 22 is large. In this case, the distance d2 is larger than a shortest distance d3 between the first side 40 and the transmission electrode Ptx. Other structures are the same as those of the first embodiment, and a description is omitted.

As large electrical power is input to the transmission foot pad Ftx, the transmission signal leaking to the circular metal layer 14 does not largely depend on the shortest distance d3 between the transmission electrode Ptx and the first side 40 of the circular metal layer 14. On the other hand, as the electrical power of the transmission signal leaking to the circular metal layer 14 is small, the signal leaking to the reception electrode Prx through the circular metal layer 14 depends on the distance d1.

Therefore, it is preferable that the shortest distance d1 between the first side 40 of the circular metal layer 14 and the reception electrode Prx is larger than the shortest distance d3 between the first side 40 and the transmission electrode Ptx. Furthermore, it is more preferable that the distance d1 is more than 1.5 times larger than d3, and it is further preferable that the distance d1 is more than two times larger than the distance d3.

For example, when a ladder-type filter having high power durability is used as the transmission filter 52 and a multi-mode filter is used as the reception filter 50, the size of the reception filter chip 20 becomes smaller than that of the transmission filter chip 22. In this case, it is possible to make the distance d1 larger than the distance d3.

Third Embodiment

Figure 7:
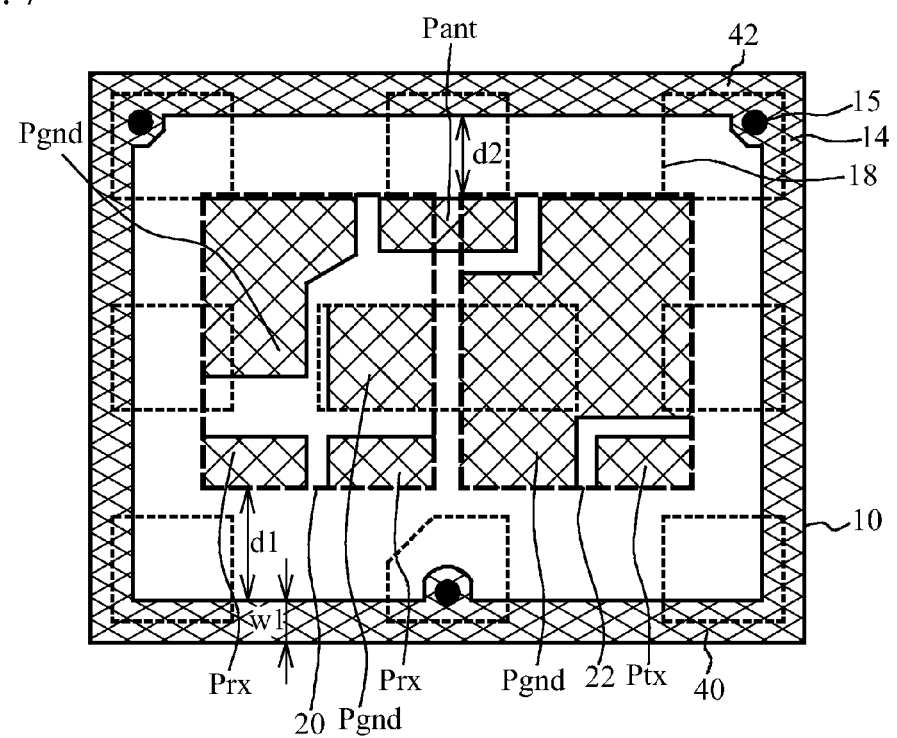
FIG. 7 is a top view illustrating a structure of a wiring substrate in a third embodiment of the present invention.

A top view of the wiring substrate 10 in a third embodiment of the present invention is illustrated in FIG. 7. In the third embodiment, unlike the first embodiment, two reception electrodes Prx are provided. A balanced signal is transmitted to two reception electrodes Prx. As with the first embodiment, the width W1 is the width of the first side 40, the distance d1 is the shortest distance between the first side 40 and the reception electrode Prx, and the distance d2 is the shortest distance between the second side 42 and the antenna electrode Pant. Other structures are the same as those of the first embodiment, and a description is omitted.

In the third embodiment, as it is possible to improve transmission-reception isolation characteristics, it is also possible to improve balance characteristics. In addition, the reception signal may be an unbalanced signal as described in the first embodiment. The transmission signal may be either a balanced signal or an unbalanced signal.

Fourth Embodiment

A top view of the wiring substrate 10 in a fourth embodiment of the present invention is illustrated in FIG. 8. In the fourth embodiment, unlike the first embodiment, the reception filter and the transmission filter are formed in a single filter chip 23. As with the first embodiment, the width W1 is the width of the first side 40, the distance d1 is the shortest distance between the first side 40 and the reception electrode Prx, and the distance d2 is the shortest distance between the second side 42 and the antenna electrode Pant. Other structures are the same as those of the first embodiment, and a description is omitted.

As described in the fourth embodiment, the reception filter 50 and the transmission filter 52 may be formed in the single filter chip 23.

In addition, elements such as an inductor or/and a capacitor constituting the matching circuit 54 of FIG. 1 may be formed in a passive element chip and mounted to the wiring substrate 10. In addition, these elements may be formed in the wiring substrate 10.

Although the embodiments of the present invention have been described in detail, it should be understood that the present invention is not limited to these specifically described embodiments, and the various change, substitutions, and alterations could be made hereto without departing from the spirit and scope of the invention.

The invention claimed is:

1. A duplexer comprising:
   a reception filter that is connected between a reception terminal and an antenna terminal;
   a transmission filter that is connected between a transmission terminal and the antenna terminal;
   a chip in which the reception filter is formed; and
   a wiring substrate, the chip being mounted on an upper surface of the wiring substrate,
   wherein the reception terminal, the transmission terminal and the antenna terminal are formed on a lower surface of the wiring substrate, a reception electrode is electrically connected to the reception terminal, a transmission electrode is electrically connected to the transmission terminal, an antenna electrode is electrically connected to the antenna terminal; a circular metal layer surrounds the reception electrode, the transmission electrode and the antenna electrode, and is electrically connected to a ground; the reception electrode, the transmission electrode, the antenna electrode and the circular metal layer are formed on the upper surface of the wiring substrate; and between a side of the circular metal layer that is closest to the reception terminal and the transmission terminal and an opposite side of the circular metal layer, the reception electrode is located closer to said side of the circular metal layer that is closest to the reception terminal and the transmission terminal than the opposite side,
   wherein a shortest distance between the reception electrode and said side of the circular metal layer that is closest to the reception terminal and the transmission terminal is larger than a width of said side of the circular metal layer, and
   wherein the shortest distance between the reception electrode and said side of the circular metal layer is larger than a shortest distance between the antenna electrode and said opposite side of the circular metal layer.

2. A duplexer comprising:
   a reception filter that is connected between a reception terminal and an antenna terminal;
   a transmission filter that is connected between a transmission terminal and the antenna terminal;
   a chip in which the reception filter is formed; and
   a wiring substrate, the chip being mounted on an upper surface of the wiring substrate,
   wherein the reception terminal, the transmission terminal and the antenna terminal are formed on a lower surface of the wiring substrate; a reception electrode is electrically connected to the reception terminal, a transmission electrode is electrically connected to the transmission terminal; an antenna electrode is electrically connected to the antenna terminal; a circular metal layer surrounds the reception electrode, the transmission electrode and the antenna electrode, and is electrically connected to a ground; the reception electrode, the transmission electrode, the antenna electrode and the circular metal layer are formed on the upper surface of the wiring substrate; and between a side of the circular metal layer that is closest to the reception terminal and the transmission terminal and an opposite side of the circular metal layer, the reception electrode is located closer to said side of the circular metal layer that is closest to the reception terminal and the transmission terminal than the opposite side, wherein a shortest distance between the reception electrode and said side of the circular metal layer that is closest to the reception terminal and the transmission terminal is larger than a width of said side of the circular metal layer, and wherein the shortest distance between the reception electrode and said side of the circular metal layer is larger than a shortest distance between the transmission electrode and said side of the circular metal layer.

3. The duplexer according to claim 2, further comprising:

a metal sealing portion that contacts the circular metal layer and seals the chip.

4. The duplexer according to claim 2, wherein the wiring substrate has a rectangular shape, wherein the reception terminal and the transmission terminal are formed on respective areas corresponding to two ends, respectively, of said side of the circular metal layer, and wherein the antenna terminal is formed in a center part of a side of the wiring substrate corresponding to said opposite side of the circular metal layer.

5. The duplexer according to claim 2, wherein the wiring substrate is in a plate shape.

6. The duplexer according to claim 2, wherein the reception filter and the transmission filter are flip-chip mounted to the wiring substrate.

7. The duplexer according to claim 2, wherein the circular metal layer is connected to the ground at the side of the circular metal layer and at another side of the circular metal layer that faces the side of the circular metal layer.

8. The duplexer according to claim 2, wherein the transmission filter is formed in the chip.

9. The duplexer according to claim 2, further comprising another chip in which the transmission filter is formed, wherein the another chip is mounted on the upper surface of the wiring substrate.

* * * * *